United States Patent
Tikoo et al.

(10) Patent No.: US 11,036,407 B1
(45) Date of Patent: Jun. 15, 2021

(54) STORAGE SYSTEM AND METHOD FOR SMART FOLDING

(71) Applicant: Western Digital Technologies, Inc., San Jose, CA (US)

(72) Inventors: Rakshit Tikoo, Uttar Pradesh (IN); Ankit Naghate, Karnataka (IN); Yogendra Singh Sikarwar, Karnataka (IN); Arun Thandapani, Karnataka (IN)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/888,017

(22) Filed: May 29, 2020

(51) Int. Cl.
*G06F 12/00* (2006.01)
*G06F 3/06* (2006.01)
*G11C 11/56* (2006.01)
*G06F 12/02* (2006.01)
*G11C 16/04* (2006.01)

(52) U.S. Cl.
CPC ............ *G06F 3/0631* (2013.01); *G06F 3/064* (2013.01); *G06F 3/0611* (2013.01); *G06F 3/0653* (2013.01); *G06F 3/0673* (2013.01); *G06F 12/02* (2013.01); *G06F 12/0246* (2013.01); *G11C 11/5621* (2013.01); *G06F 2212/1024* (2013.01); *G06F 2212/1036* (2013.01); *G11C 16/0483* (2013.01); *G11C 2211/5641* (2013.01); *G11C 2211/5644* (2013.01)

(58) Field of Classification Search
CPC ...... G06F 3/0631; G06F 3/0611; G06F 3/064; G06F 3/0653; G06F 3/0673; G06F 12/0246; G06F 12/02; G06F 2212/1024; G06F 2212/1036; G11C 2211/5641; G11C 2211/5644
See application file for complete search history.

(56) References Cited

U.S. PATENT DOCUMENTS

| 10,732,877 | B1 * | 8/2020 | Gopalakrishnan ........................... G11C 11/5621 |
| 2016/0085455 | A1 * | 3/2016 | Cohen ..................... G06F 11/14 711/103 |
| 2016/0124668 | A1 * | 5/2016 | Inbar .................... G06F 12/0246 711/162 |
| 2016/0162215 | A1 * | 6/2016 | Jayaraman ............ G06F 3/0688 711/103 |
| 2019/0371394 | A1 * | 12/2019 | Yang .................. G11C 16/0408 |
| 2021/0124519 | * | 4/2021 | Tanpairoj .............. G06F 3/0647 |
| 2021/0124693 | * | 4/2021 | Kim ...................... G06F 12/123 |

OTHER PUBLICATIONS

Chang et al., "FastRead: Improving Read Performance for Multilevel-Cell Flash Memory", IEEE Transactions on Very Large Scale Integration, vol. 24, No. 9, Sep. 2016 (Year: 2016).*

* cited by examiner

*Primary Examiner* — John A Lane

(74) *Attorney, Agent, or Firm* — Brinks Gilson & Lione

(57) ABSTRACT

A storage system and method for smart folding are provided. In one example, the storage system has a memory with a plurality of single level cell (SLC) blocks and a multi-level cell (MLC) block. The MLC block has a plurality of pages, each with a different sense time. The storage system tracks a read count of each of the plurality of SLC blocks and determines how to fold the plurality of SLC blocks into the plurality of pages based on the read count of each of the plurality of SLC blocks and the sense time of each of the plurality of pages. In this way, SLC blocks with higher read counts can be folded into pages that have faster sense times.

20 Claims, 6 Drawing Sheets

STORAGE SYSTEM AND METHOD FOR SMART FOLDING

BACKGROUND

A memory in a storage system can have single level cell (SLC) blocks of memory and multiple-level cell (MLC) blocks of memory. The memory cells in the SLC blocks store one bit of data per memory cell, and the memory cells in the MLC blocks store multiple bits of data per memory cell. Data is initially stored in multiple SLC blocks, and, at some later point, data is moved from the SLC blocks to a MLC block to increase storage density. The process of moving data from SLC blocks to pages of an MLC block is referred to as "folding." The storage system can randomly select which SLC blocks are folded into the various pages in an MLC block.

DETAILED DESCRIPTION

By way of introduction, the below embodiments relate to a storage system and method for smart folding. In one embodiment, a storage system is provided comprising a memory and a controller. The memory comprises a plurality of single level cell (SLC) blocks and a multi-level cell (MLC) block, wherein the MLC block comprises a plurality of pages, each with a different sense time. The controller is configured to track a read count of each of the plurality of SLC blocks and determine how to fold the plurality of SLC blocks into the plurality of pages based on the read count of each of the plurality of SLC blocks and the sense time of each of the plurality of pages. Other embodiments are provided.

Figure 1A:
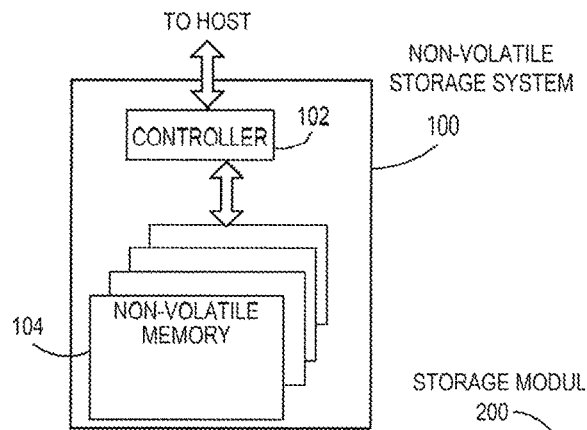
FIG. 1A is a block diagram of a non-volatile storage system of an embodiment.
Figure 1B:
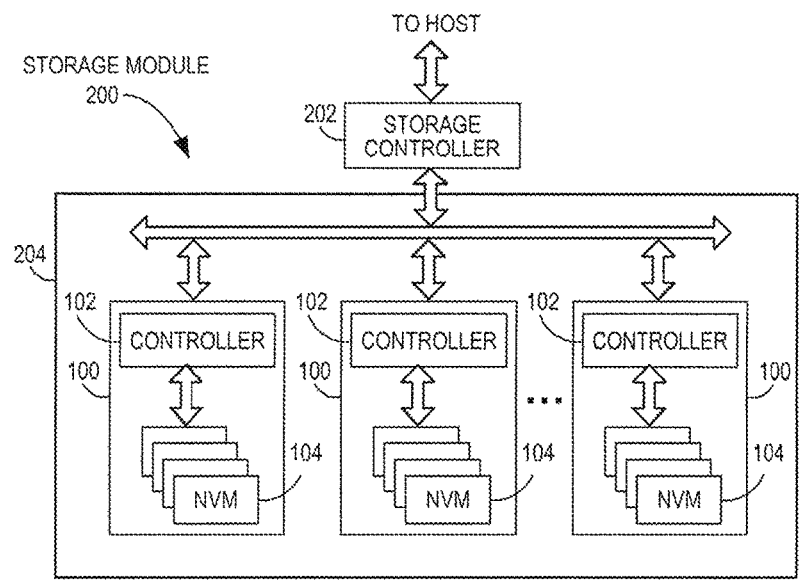
FIG. 1B is a block diagram illustrating a storage module of an embodiment.
Figure 1C:
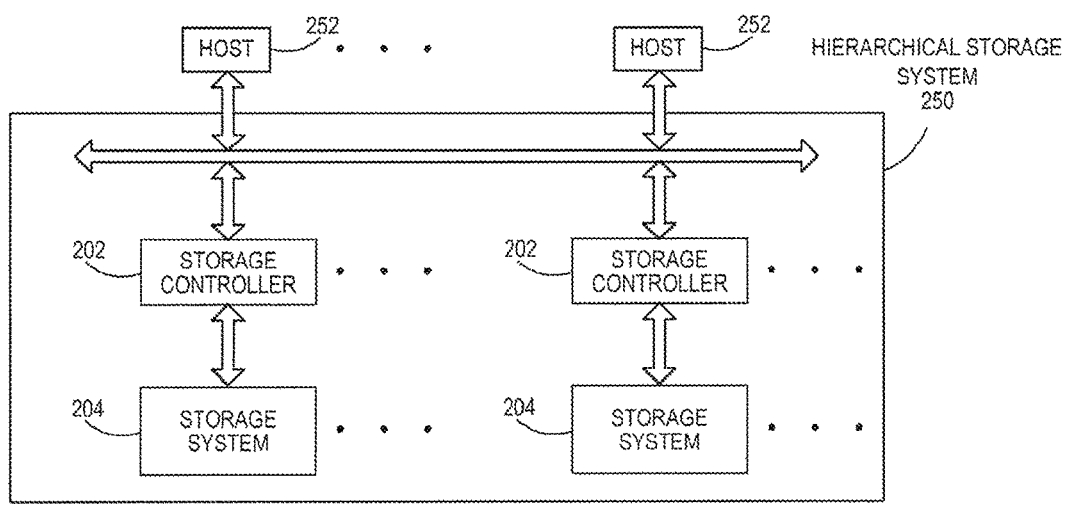
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 (sometimes referred to herein as a storage device or just device) according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a non-volatile memory controller (e.g., a flash, resistive random-access memory (ReRAM), phase-change memory (PCM), or magnetoresistive random-access memory (MRAM) controller)) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a non-volatile memory controller is a device that manages data stored on non-volatile memory and communicates with a host, such as a computer or electronic device. A non-volatile memory controller can have various functionality in addition to the specific functionality described herein. For example, the non-volatile memory controller can format the non-volatile memory to ensure the memory is operating properly, map out bad non-volatile memory cells, and allocate spare cells to be substituted for future failed cells. Some part of the spare cells can be used to hold firmware to operate the non-volatile memory controller and implement other features. In operation, when a host needs to read data from or write data to the non-volatile memory, it can communicate with the non-volatile memory controller. If the host provides a logical address to which data is to be read/written, the non-volatile memory controller can convert the logical address received from the host to a physical address in the non-volatile memory. (Alternatively, the host can provide the physical address.) The non-volatile memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Also, the structure for the "means" recited in the claims can include, for example, some or all of the structures of the controller described herein, programmed or manufactured as appropriate to cause the controller to operate to perform the recited functions.

Non-volatile memory die 104 may include any suitable non-volatile storage medium, including resistive random-access memory (ReRAM), magnetoresistive random-access memory (MRAM), phase-change memory (PCM), NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cell (QLC) or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some storage system architectures (such as the ones shown in FIGS. 1B and 1C), 2, 4, 8 or more memory channels may exist between the controller and the memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), peripheral component interconnect express (PCIe) interface, or double-data-rate (DDR) interface. Storage module 200, in one embodiment, may be a solid state drive (SSD), or non-volatile dual in-line memory module (NVDIMM), such as found in server PC or portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a Non-Volatile Memory Express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
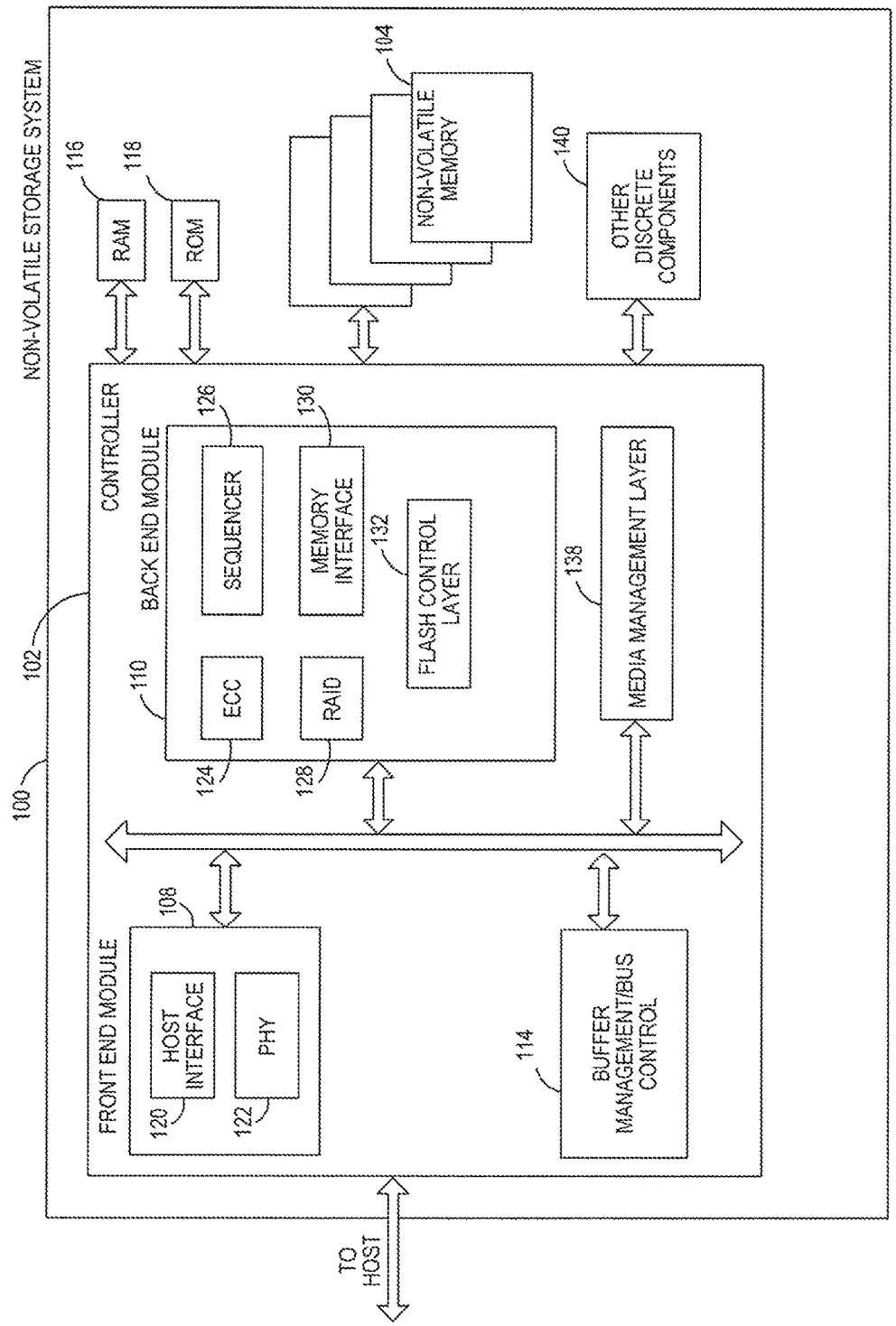
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. The controller 102 may sometimes be referred to herein as a NAND controller or a flash controller, but it should be understood that the controller 102 can be used with any suitable memory technology, example of some of which are provided below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, serially attached small computer system interface (SAS), Fibre Channel, universal serial bus (USB), PCIe, and NVMe. The host interface 120 typically facilitates transfer for data, control signals, and timing signals.

Back end module 110 includes an error correction code (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
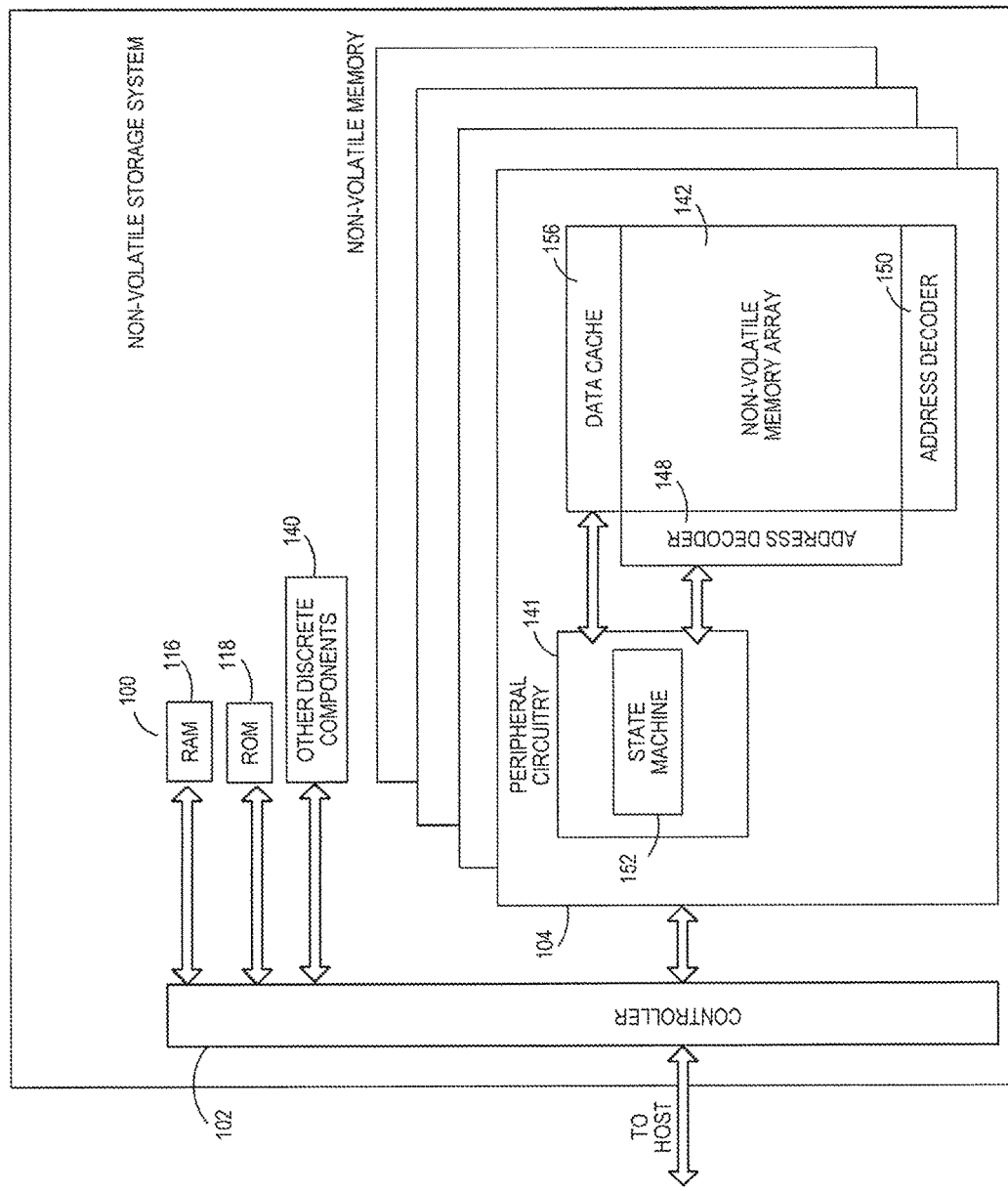
FIG. 2B is a block diagram illustrating components of the non-volatile storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including ReRAM, MRAM, PCM, NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Returning again to FIG. 2A, the flash control layer 132 (which will be referred to herein as the flash translation layer (FTL) or, more generally, the "media management layer," as the memory may not be flash) handles flash errors and interfaces with the host. In particular, the FTL, which may be an algorithm in firmware, is responsible for the internals of memory management and translates writes from the host into writes to the memory 104. The FTL may be needed because the memory 104 may have limited endurance, may only be written in multiples of pages, and/or may not be written unless it is erased as a block. The FTL understands these potential limitations of the memory 104, which may not be visible to the host. Accordingly, the FTL attempts to translate the writes from host into writes into the memory 104.

The FTL may include a logical-to-physical address (L2P) map (sometimes referred to herein as a table or data structure) and allotted cache memory. In this way, the FTL translates logical block addresses ("LBAs") from the host to physical addresses in the memory 104. The FTL can include other features, such as, but not limited to, power-off recovery (so that the data structures of the FTL can be recovered in the event of a sudden power loss) and wear leveling (so that the wear across memory blocks is even to prevent certain blocks from excessive wear, which would result in a greater chance of failure).

As described above, the memory 104 in the storage system 100 can have single level cell (SLC) blocks of memory and multiple-level cell (MLC) blocks of memory. The memory cells in the SLC blocks store one bit of data per memory cell, and the memory cells in the MLC blocks store multiple bits of data per memory cell. For example, in a quad-level cell (QLC) block, the memory cells store four bits of data per memory cell. While the below examples will be discussed in terms of QLC blocks, it should be understood that these embodiments can be used with other types of multiple-level cell blocks.

The controller 102 can initially store data in multiple SLC blocks and, at some later point, move the data from the SLC blocks to a QLC block to increase storage density. The process of moving data from SLC blocks to pages of a QLC block is referred to as "folding." In operation, the controller 102 selects four SLC source blocks and copies their data to four pages in a QLC block. The four pages in the QLC block are referred to the lower page (LP), middle page (MP), upper page (UP), and top page (TP). Prior storage systems randomly select which SLC source blocks are folded into the various QLC pages. However, in the below embodiments, the storage system 100 selects which SLC source blocks are folded into the various QLC pages based on how often each of the SLC blocks was read and the sense time of each of the plurality of pages. This process of controlling which source SLC block goes to which QLC page (LP, MP, UP, and TP) is referred to herein as "smart folding" and can be used to improve read performance.

Figure 3:
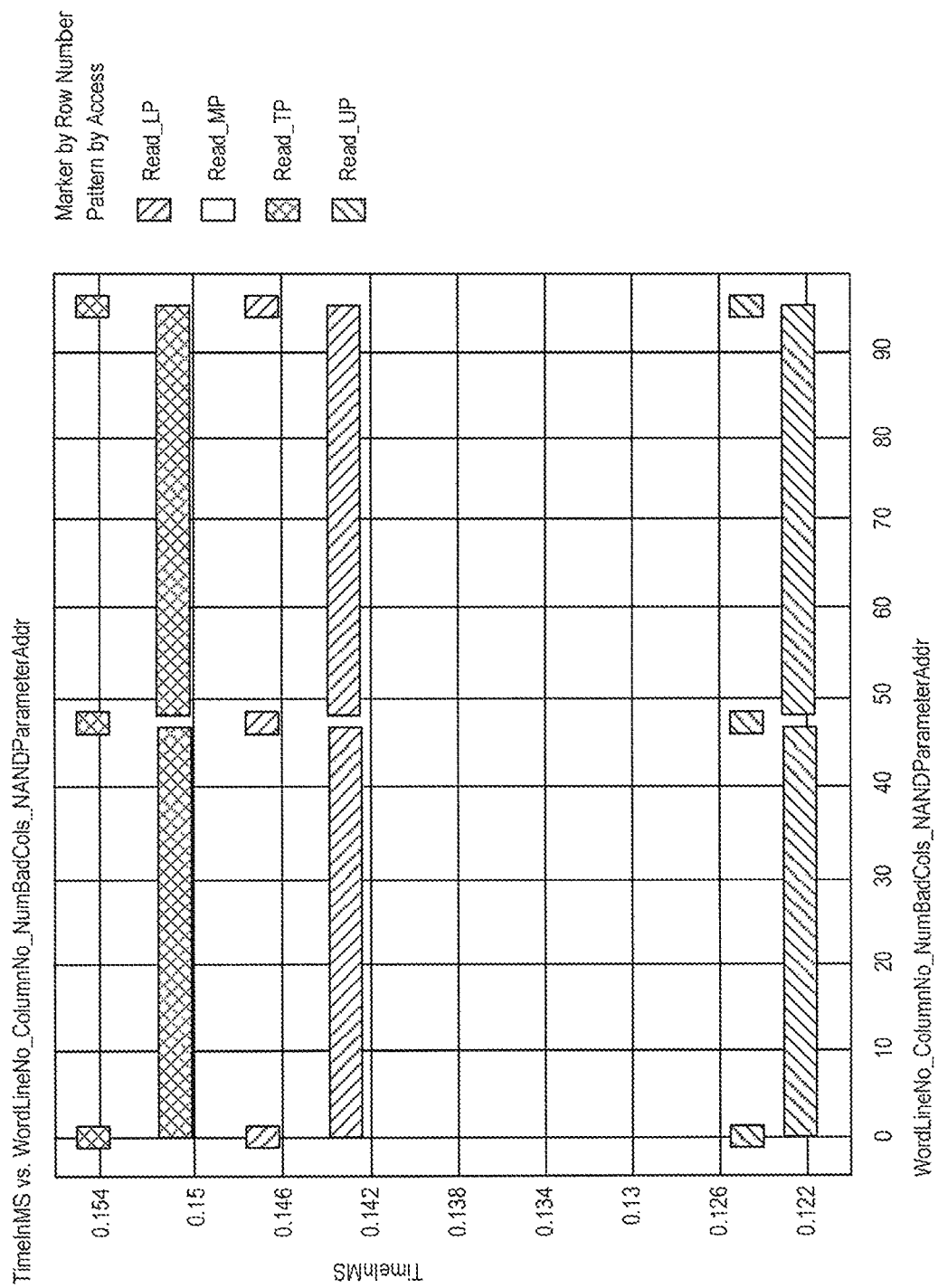
FIG. 3 is a graph showing sense times for different pages of a quad-level cell (QLC) memory block of an embodiment.

As illustrated in the graph in FIG. 3, different pages of a QLC block have difference sense times for reading a memory cell in the page. The graph, which plots data collected for BiCS4×4 drives, shows the sense times for LP, MP, UP, and TP QLC pages. As shown in this graph, the UP sense time is ~14.7% faster than the LP sense time and ~19.2% faster than the MP and TP sense times. Hence, it may be preferred to detect the source SLC block with a high number of reads (hot data) and fold it into the QLC page with the fastest read time to improve overall read performance.

Any suitable mechanism can be used to determine the number of times an SLC block has been read. In one embodiment, the controller 102 tracks a read count of each SLC block and folds data from SLC blocks to pages of a QLC block in the order of their read counter value (i.e., the SLC block with the highest read counter value is folded into the QLC page with the fastest read time). This will ensure that the pages with hot data are read faster than the pages with colder data, hence increasing the overall performance. The controller 102 can implement an algorithm that tracks the read counts of every metablock in the memory 103 whenever a read is done on any page in the metablock. The controller 102 can log the read count in a designated block in the memory 104. Every erase operation can reset the read counter for that block.

Figure 4:
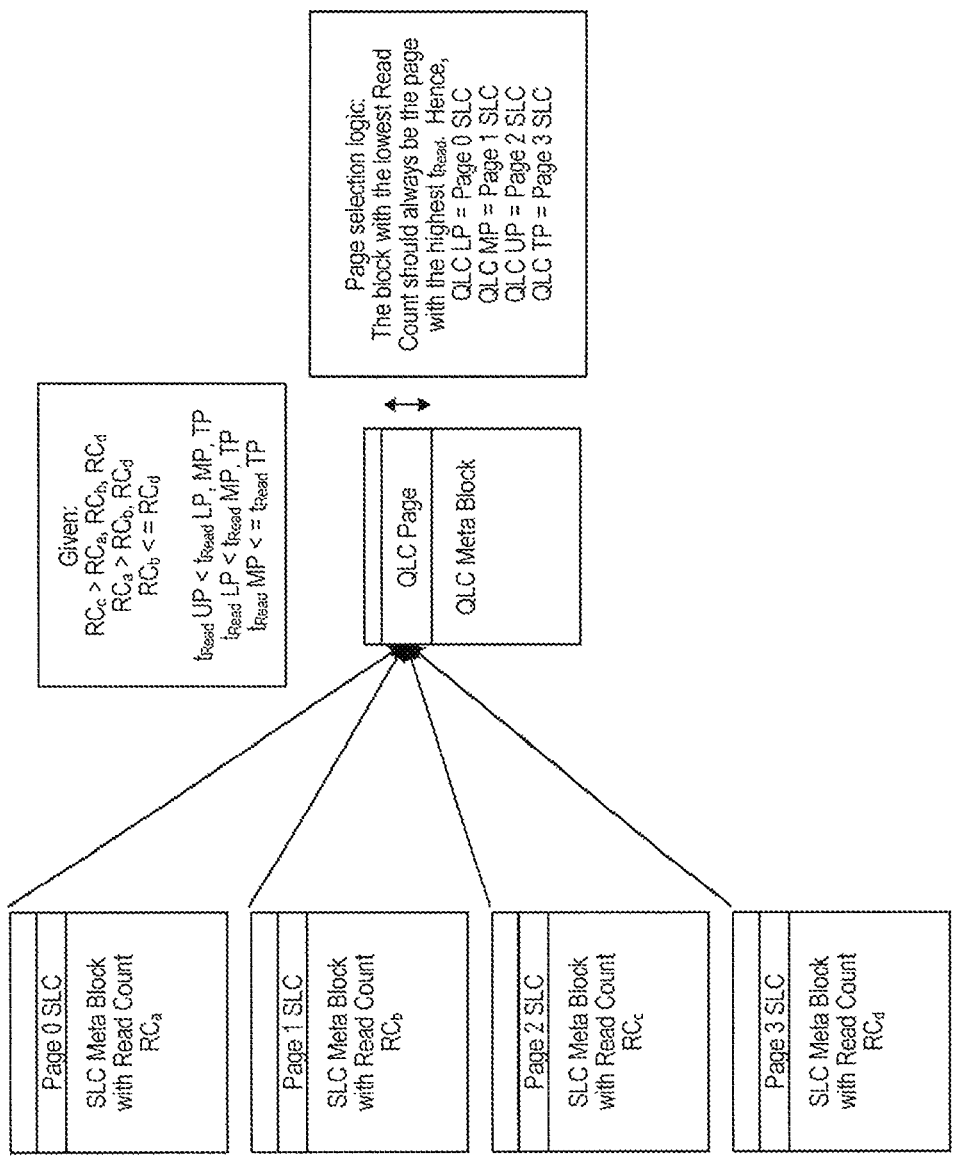
FIG. 4 is a diagram illustrating a smart folding operation of an embodiment.

An example of the smart folding operation is shown in diagram in FIG. 4. In this example, there are four SLC source blocks and one QLC destination block. The read counters (RC) of each SLC block are $RC_a$, $RC_b$, $RC_c$, and $RC_d$, respectively. From the graph shown in FIG. 3, the read times ($t_{Read}$UP) can be characterized as: $t_{Read}UP < t_{Read}LP < t_{Read}UP <= t_{Read}TP$. If $RC_c > RC_a > RC_b > RC_d$, the controller 102 can select the source SLC block in such a way that the highest RC block goes to the lowest $t_{Read}$ page in the QLC to provide the fastest read. So, the $RC_c$ block gets folded to the UP of QLC, the $RC_a$ block gets folded to the LP of QLC, the $RC_b$ block gets folded to the MP of QLC, and the $RC_d$ block gets folded to the TP of QLC.

Figure 5:
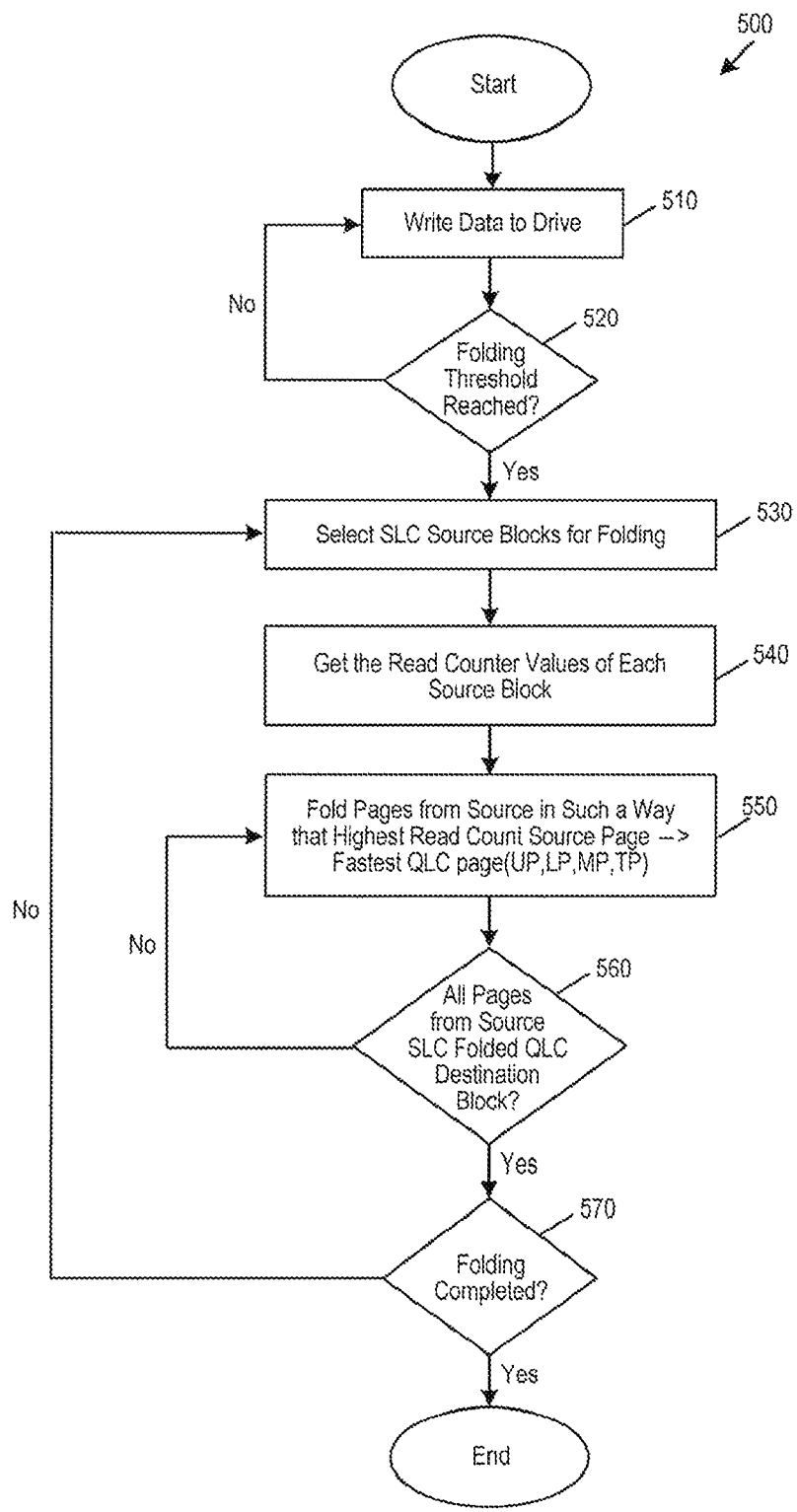
FIG. 5 is a flow chart of a smart folding method of an embodiment.

FIG. 5 is a flow chart 500 that illustrates this method. As shown in FIG. 5, data is written to the memory 104 in the storage system (drive) 100 (act 510). The controller 102 then determines if a folding threshold has been reached (act 520). If it has, the controller 102 selects the SLC blocks for folding (act 530) and gets the read counter values of each of the source blocks (act 540). Next, the controller 02 folds the pages from the source SLC blocks in such a way that the highest read count source page is folded into the faster QLC page (act 550). When all the pages from the source SLC blocks have been folded into the QLC pages (act 560), the controller 102 determines if the folding is complete (act 570). If it is, the process ends.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A storage system comprising:
   a memory comprising a plurality of single level cell (SLC) blocks and a multi-level cell (MLC) block, wherein the MLC block comprises a plurality of pages, each with a different sense time; and
   a controller configured to:
      track a read count of each of the plurality of SLC blocks; and
      determine how to fold the plurality of SLC blocks into the plurality of pages based on the read count of each of the plurality of SLC blocks and the sense time of each of the plurality of pages.

2. The storage system of claim 1, wherein an SLC block with a highest read count is folded into a page in the MLC block that has a fastest sense time.

3. The storage system of claim 1, wherein the MLC block comprises a quad-level cell (QLC) block.

4. The storage system of claim 3, wherein the plurality of pages comprise a lower page, a middle page, an upper page, and a top page.

5. The storage system of claim 1, wherein the controller is further configured to determine when to fold the plurality of SLC blocks into the MLC block.

6. The storage system of claim 1, wherein the controller is further configured to select the plurality of SLC blocks from an additional plurality of SLC blocks in the memory.

7. The storage system of claim 1, wherein the memory comprises a three-dimensional memory.

8. In a storage system comprising a memory comprising a plurality of single level cell (SLC) blocks and a multi-level cell (MLC) block, wherein the MLC block comprises a plurality of pages, each with a different sense time, a method comprising:
  determining a number of times each of the plurality of SLC blocks has been read; and
  folding the plurality of SLC blocks into the plurality of pages such that an SLC block that had been read more than another SLC block is folded into a page with a faster sense time than a page used to fold the another SLC block.

9. The method of claim 8, wherein an SLC block that was read a highest number of times is folded into a page in the MLC block that has a fastest sense time.

10. The method of claim 8, wherein the MLC block comprises a quad-level cell (QLC) block.

11. The method of claim 10, wherein the plurality of pages comprise a lower page, a middle page, an upper page, and a top page.

12. The method of claim 8, further comprising determining when to fold the plurality of SLC blocks into the MLC block.

13. The method of claim 8, further comprising selecting the plurality of SLC blocks from an additional plurality of SLC blocks in the memory.

14. A storage system comprising:
  a memory comprising a plurality of single level cell (SLC) blocks and a multi-level cell (MLC) block, wherein the MLC block comprises a plurality of pages, each with a different sense time; and
  means for folding the plurality of SLC blocks into the plurality of pages based on how often each of the plurality of SLC blocks was read and the sense time of each of the plurality of pages.

15. The storage system of claim 14, wherein an SLC block that was read most often is folded into a page in the MLC block that has a fastest sense time.

16. The storage system of claim 14, wherein the MLC block comprises a quad-level cell (QLC) block.

17. The storage system of claim 16, wherein the plurality of pages comprise a lower page, a middle page, an upper page, and a top page.

18. The storage system of claim 14, further comprising means for determining when to fold the plurality of SLC blocks into the MLC block.

19. The storage system of claim 14, further comprising means for selecting the plurality of SLC blocks from an additional plurality of SLC blocks in the memory.

20. The storage system of claim 14, wherein the memory comprises a three-dimensional memory.

* * * * *